US006437699B1

(12) United States Patent
Hayakawa

(10) Patent No.: US 6,437,699 B1
(45) Date of Patent: Aug. 20, 2002

(54) BATTERY CAPACITY INDICATION CIRCUIT AND INDICATION METHOD THEREOF, AND BATTERY-OPERATED ELECTRONIC DEVICE AND CELLULAR COMMUNICATION TERMINAL APPARATUS COMPRISING THE INDICATION CIRCUIT

(75) Inventor: Hideki Hayakawa, Hachioji (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/714,214

(22) Filed: Nov. 17, 2000

(30) Foreign Application Priority Data

Nov. 19, 1999 (JP) ............................................ 11-330230

(51) Int. Cl.[7] .............................................. G08B 21/00
(52) U.S. Cl. ..................... 340/636; 340/660; 340/691.6; 340/693.1; 340/693.2; 340/693.3; 340/311.3; 455/572; 455/343; 455/573
(58) Field of Search ................................. 340/636, 660, 340/661, 662, 663, 664, 691.6, 693.1, 693.2, 693.3, 693.4, 311.1; 455/67.1, 572, 573

(56) References Cited

U.S. PATENT DOCUMENTS

| | | | | |
|---|---|---|---|---|
| 5,032,825 A | * | 7/1991 | Kuznicki | 340/636 |
| 5,047,961 A | * | 9/1991 | Simonsen | 340/636 |
| 5,248,929 A | * | 9/1993 | Burke | 340/636 |
| 5,311,441 A | * | 5/1994 | Tayama et al. | 364/483 |
| 5,672,953 A | * | 9/1997 | Kim | 320/163 |
| 5,678,229 A | * | 10/1997 | Seki et al. | 455/343 |
| 5,744,931 A | * | 4/1998 | Arai et al. | 340/636 |

* cited by examiner

Primary Examiner—Jeffery Hofsass
Assistant Examiner—Daniel Previl
(74) Attorney, Agent, or Firm—Oblon, Spivak, McClelland, Maier & Neustadt, P.C.

(57) ABSTRACT

When a remaining capacity of a battery is displayed by remaining capacity display control means, operation state discrimination function discriminates an operation state of an apparatus and also discriminates whether battery output voltage Vout is greater than discrimination value Vp when the apparatus is in reception indication operation. If the battery output voltage Vout is greater than the discrimination value Vp, remaining capacity of the battery corresponding to the battery output voltage Vout in a standby state immediately before the start of the reception indication operation is displayed on LCD. If the battery output voltage Vout is equal to or smaller than the discrimination value Vp, the remaining capacity of the battery corresponding to the battery output voltage Vout of this time is displayed as it is on the LCD.

25 Claims, 5 Drawing Sheets

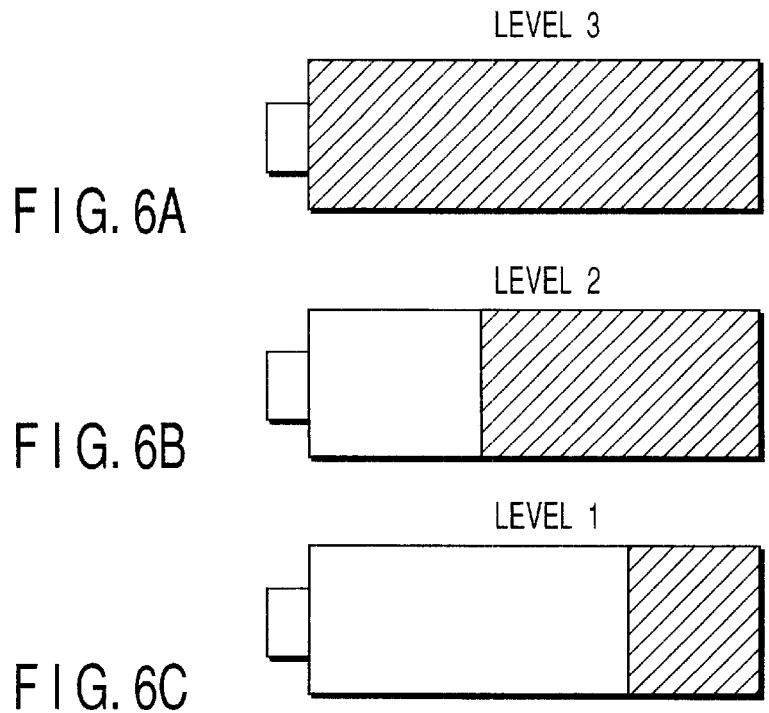
FIG. 6A — LEVEL 3
FIG. 6B — LEVEL 2
FIG. 6C — LEVEL 1
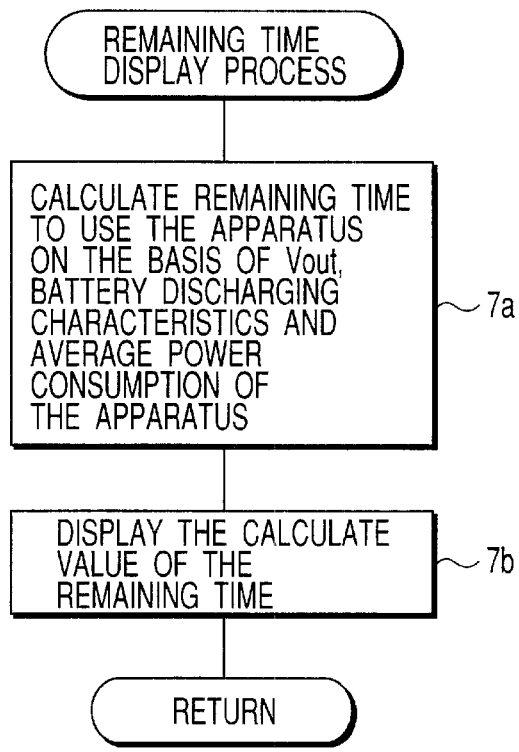
FIG. 7

BATTERY CAPACITY INDICATION CIRCUIT AND INDICATION METHOD THEREOF, AND BATTERY-OPERATED ELECTRONIC DEVICE AND CELLULAR COMMUNICATION TERMINAL APPARATUS COMPRISING THE INDICATION CIRCUIT

CROSS-REFERENCE TO RELATED APPLICATIONS

This application is based upon and claims the benefit of priority from the prior Japanese Patent Application No. 11-330230, filed Nov. 19, 1999, the entire contents of which are incorporated herein by reference.

BACKGROUND OF THE INVENTION

This invention relates to a battery capacity indication circuit and an indication method thereof for use in an electronic device having a battery as a power supply, for example, a cellular communication terminal apparatus such as a cellular telephone or the like, a portable personal computer, a PDA (Personal Digital Assistants), a portable audio player, and a video camera, to detect an output of the battery and provide information relating to the capacity thereof and, more particularly, to a battery-operated electronic device and a cellular communication terminal apparatus comprising the battery capacity indication circuit.

Recently, various cellular communication terminal apparatuses such as cellular telephones, PDA and the like have been used in accordance with the development of the communications technology and the variety of demand on the cellular communication.

Incidentally, the terminal apparatus of this kind has a battery as its power supply. For this reason, the battery needs to be constantly charged or exchanged to the other. Thus a battery capacity indication circuit is generally provided in the cellular communication terminal apparatus. This circuit discriminates the remaining capacity of the battery on the basis of the output voltage thereof and displays it on a display unit. Therefore, the user can confirm the remaining capacity of the battery by this display unit, at any time, during the operation of the terminal apparatus.

However, the conventional battery capacity indication circuit of this kind has the following problem that should be solved. That is, current consumption of the apparatus is temporarily increased when the apparatus becomes in a specific operation state, for example, at the time of outputting a ringing tone accompanying an incoming call, operating a vibrator, turning on a back light of the liquid crystal display, and the like. Thus, the battery output shows the voltage drop. A current apparatus has a battery of small capacity for downsizing and weight reduction. Therefore, the voltage drop of the battery output cannot be neglected.

In the conventional remaining capacity indication circuit, however, the detected value is always displayed as it is without considering the voltage drop of the battery output. For this reason, an erroneous remaining capacity lower than an actual value is displayed in the above-described specific operation state. In this case, it is not preferable that the user may commit an erroneous operation of turning off the power supply of the apparatus by judging that the battery would be exhausted soon, though the apparatus can be still operated.

On the other hand, canceling the detection of the battery voltage not to display the remaining capacity in the above-described specific operation state has been proposed to prevent such inconvenience. According to this manner, however, the user cannot confirm the remaining capacity of the battery during the operations in the specific operation state. For this reason, even if the remaining capacity of the battery is reduced and the battery voltage is lower than a predetermined value such that the power-down suddenly occurs, the user cannot confirm the reason therefor.

BRIEF SUMMARY OF THE INVENTION

This invention is accomplished in consideration of the above-described circumstances. The object of this invention is to provide a battery capacity indication circuit and indication method thereof capable of exactly indicating a battery capacity even if the battery output is temporarily varied in a specific operation state of the electronic circuit, and also provide a battery-operated electronic device and cellular communication terminal apparatus comprising the indication circuit.

To achieve the object, a battery capacity indication circuit according to this invention comprises a function of detecting and keeping an output value of the battery, a function of discriminating whether the electronic circuit is in a first operation state of consuming the power of smaller than a predetermined value or a second operation state of consuming the power of greater than the predetermined value, a function of comparing the output value of the battery detected by the detection function with a predetermined threshold value if it is discriminated by the discrimination function that the electronic circuit is in the second operation state, and a function about the battery capacity. The indication function generates and indicates information about the capacity of the battery on the basis of the output value of the battery detected by the detection function in the first operation state before the electronic circuit becomes in the second operation state, if it is determined by the comparison function that the output value of the battery is equal to or greater than the threshold value.

Therefore, according to this invention, even in a case where a specific operation of consuming comparatively large current, such as outputting a reception ringing, vibrating operation of the vibrator, putting on the display backlight or the like, is executed in the electronic circuit, if the output value of the battery is still very great, the remaining capacity of the battery detected in a standby state immediately before the specific operation or in a communication state is displayed without receiving influence of temporary voltage drop of the battery voltage caused by the specific operation. For this reason, inconvenience of erroneously displaying the remaining capacity of the battery smaller than the actual value can be prevented, and thereby the user can exactly recognize the remaining capacity of the battery.

In addition, the battery capacity indication circuit according to this invention is characterized in that the indication function further comprises a function of generating and indicating information about the capacity of the battery on the basis of a current output value thereof, when it is discriminated as a result of the comparison executed by the comparison means that the output value of the battery is smaller than the threshold value.

Therefore, according to this invention, even in a specific operation state, the user can confirm that the remaining capacity of the battery is being exhausted and can thereby properly judge whether or not he can continue the subsequent operations. In addition, even if the supply of the power is suddenly interrupted during the specific operation, the user can clearly understand the reason.

A plurality of specific examples of the indication function can be conceived as follows.

The first structure is to generate and indicate the information representing the remaining capacity of the battery on the basis of the output value thereof detected by the detection function.

The second structure is to generate and indicate the information representing the power consumption of the battery on the basis of the output value thereof detected by the detection function.

The third structure is to obtain the remaining capacity of the battery on the basis of the output value thereof detected by the detection function, obtain the remaining time to operate the electric circuit from the remaining capacity, and indicate the information representing the remaining time.

The fourth structure is to obtain the remaining capacity of the battery on the basis of the output value thereof detected by the detection function, obtain the remaining number of times to operate the electric circuit from the remaining capacity, and indicate the information representing the remaining number of times.

Further, the information can be displayed by selecting one or more of the first to fourth structures, in accordance with the user's selecting operation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A, 6B and 6C are diagrams showing display examples of the remaining capacity; and FIG. 7 is a flow chart showing the contents of a remaining time displaying process in a remaining capacity indication circuit according to the other embodiment of the present invention.

DETAILED DESCRIPTION OF THE INVENTION

Figure 1:
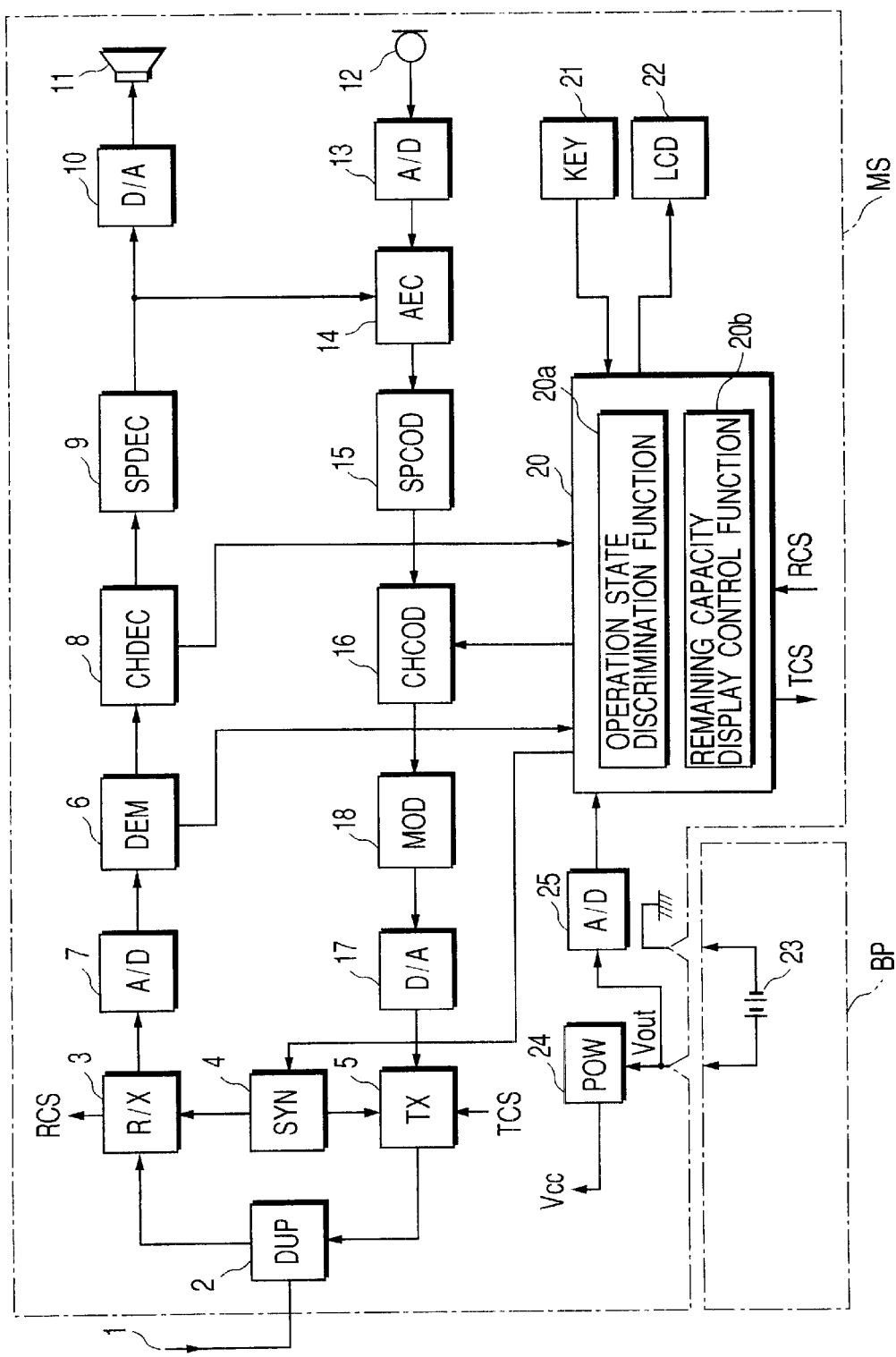
FIG. 1 is a block diagram showing a cellular communication terminal apparatus comprising a remaining capacity indication circuit according to the embodiment of the present invention.

FIG. 1 is a block diagram showing a cellular communication terminal apparatus comprising a battery capacity indication circuit according to the embodiment of the present invention.

A radio carrier signal transmitted from a base station (not shown) via a radio channel is input to a receiver (RX) 3 via an antenna 1 and a duplexer (DUP) 2. In the receiver 3, the radio carrier signal is synthesized with a receiving local oscillation signal that is output from a frequency synthesizer (SYN) 4 and converted into a receiving intermediate frequency signal. The receiving intermediate frequency signal is subjected to the sampling in an A/D converter 7 and input to a digital demodulation circuit (DEM) 6. In the digital demodulation circuit 6, the receiving intermediate frequency signal is subjected to the frame synchronization and bit synchronization and then digitally demodulated.

A received signal strength detector is provided in the receiver 3. A received signal strength RCS of the radio carrier signal detected by the received signal strength detector is input to a control circuit (CONT) 20. The synchronization information obtained by the frame synchronization and bit synchronization is also input to the control circuit 20.

The digital demodulation signal that is output from the digital demodulation circuit 6 includes a digital speech signal and a digital control signal. The digital control signal is supplied to the control circuit 20 and identified. The digital speech signal is subjected to error correction and deinterleaving in a channel decoder (CH-DEC) 8. The digital speech signal subjected to the error correction and deinterleaving is subjected to speech decoding in a speech decoder (SP-DEC) 9, converted to an analog speech signal by a D/A converter 10, supplied to a loud-speaker 11 and finally output from the loud-speaker 11.

On the other hand, a speech signal which is input by a microphone 12 is sampled by an A/D converter 13, input to a speech encoder (SP-COD) 15 via an echo canceller (AEC) 14, and subjected to speech encoding in the speech encoder 15. The encoded digital speech signal obtained from the speech encoding is subjected to error correction and interleaving in a channel encoder (CH-COD) 16 together with the digital control signal that is output from the control circuit 20, and is input to a digital modulation circuit (MOD) 18. In the digital modulation circuit 18, a modulation signal corresponding to the encoded digital speech signal is generated. The modulation signal is converted into an analog signal in a D/A converter 17 and input to a transmitter (TX) 5. In the transmitter 5, the modulation signal is synthesized with a transmission local oscillation signal that is output from the frequency synthesizer 4 and converted into a transmission radio frequency signal, which is amplified by a transmission power amplifier. The radio frequency signal output from the transmitter 5 is transmitted from the antenna 1 to a base station (not shown) via the duplexer 2.

The cellular communication terminal apparatus is composed of an apparatus main body unit MS and a battery pack unit BP detachably mounted on the main body MS via a connector. A rechargeable battery 23 constituted by, for example, a lithium ion battery is contained in the battery pack unit BP. Output voltage Vout of the battery 23 is supplied to a power supply circuit (POW) 24 of the apparatus main body MS via a connector. The power supply circuit 24 generates a predetermined operation voltage Vcc on the basis of the output voltage Vout of the battery and supplies it to each circuit in the apparatus main body MS. The output voltage Vout of the battery 23 is also input to an A/D converter 25 serving as a voltage detection circuit. The A/D converter 25 inputs a digital value representing a value of the battery output voltage Vout to the control circuit 20.

Reference numeral 21 denotes a key input section (KEY), which includes a send key, an end key, a digit keys and various function keys. Reference numeral 22 denotes a liquid crystal display (LCD), which displays the dial information of a communication partner, operation state of the apparatus, and the like.

The control circuit 20 comprises, for example, a microcomputer as a main control unit. The control circuit 20 has an operation state discrimination function 20a and a remaining capacity display control function 20b as new functions associated with this invention, in addition to general control functions for the radio connection control, communication control and the like.

The operation state discrimination function 20a discriminates whether the operation state of the apparatus is a specific operation state in which the current consumption is equal to or higher than a predetermined value, such as the output of the ringing tone, operation of the vibrator or turning on the backlight of the LCD 22, or a general operation state in which the current consumption is smaller than a predetermined value, such as a standby state, a communication state or the like.

The remaining capacity display control function 20b generates remaining capacity display information in accordance with the discrimination result of the operation state discrimination function 20a at the time of displaying the remaining capacity of the battery 23. That is, when the operation state is the general operation state, the remaining capacity display control function 20b generates remaining capacity display information in accordance with the battery output voltage value Vout currently detected by the A/D converter 25 and the discharging characteristics of the battery and the information is displayed on the LCD 22.

When the operation state is a specific operation state, the battery output voltage value Vout is compared with a predetermined discrimination value Vp. If the battery output voltage value Vout is higher than the predetermined discrimination value Vp, the remaining capacity display information is generated on the basis of the battery output voltage value Vout in the standby state obtained immediately before the apparatus becomes in a specific operation state. The generated information is displayed on the LCD 22. On the other hand, if the battery output voltage value Vout is smaller than the predetermined discrimination value Vp, the remaining capacity display information is generated on the basis of the battery output voltage value Vout detected by the A/D converter 25 and the information is displayed on the LCD 22.

Figure 2:
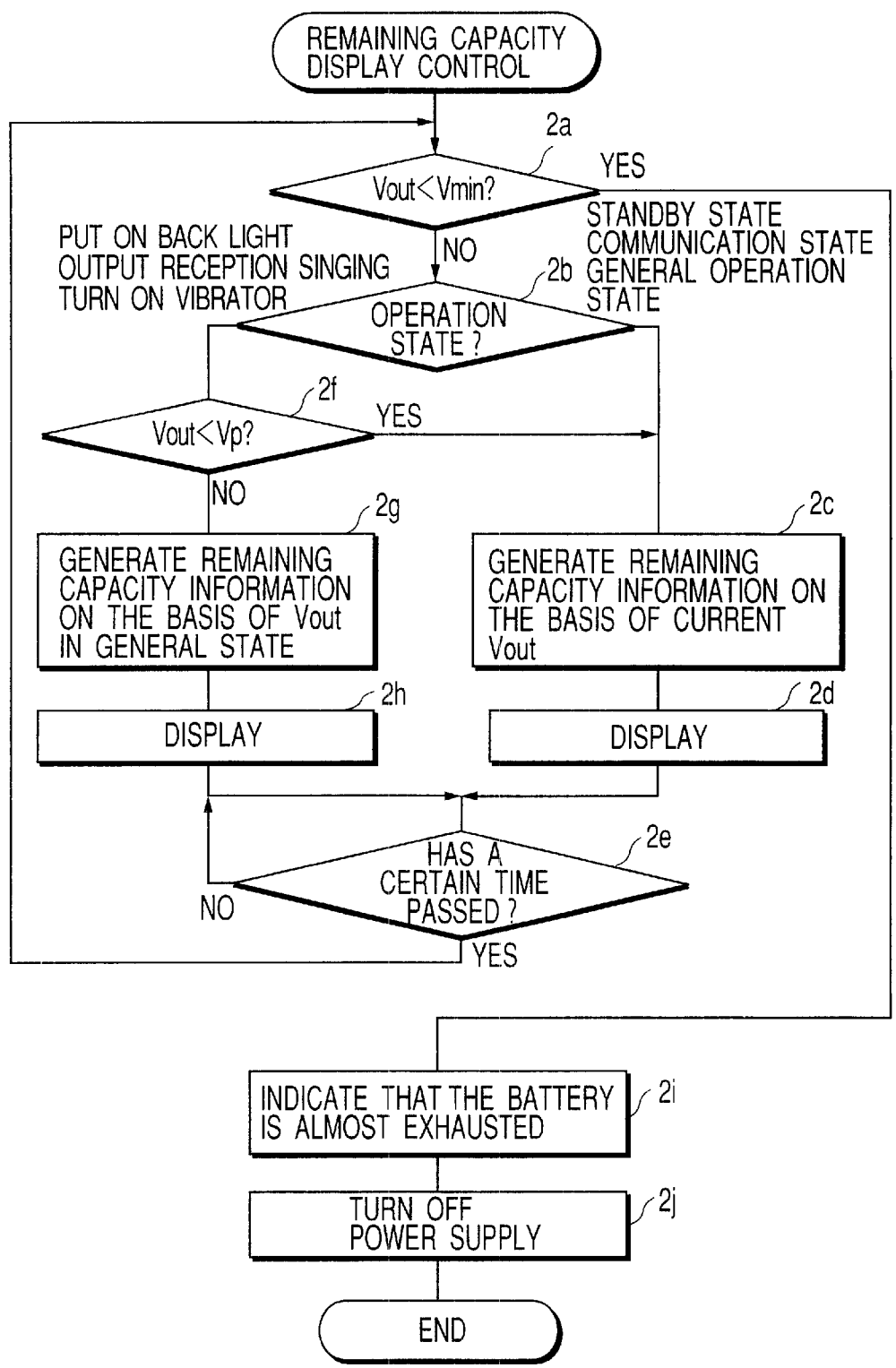
FIG. 2 is a flow chart showing steps and contents of remaining capacity display operation executed by a control circuit of the apparatus shown in FIG. 1.

Next, the remaining capacity display operation in the above-constituted apparatus will be explained. FIG. 2 is a flow chart showing steps and contents of the remaining capacity display operation executed by the control circuit 20.

When the apparatus is in use, the control circuit 20 discriminates whether or not the battery output voltage Vout input from the A/D converter 25 is lower than a minimum operation guarantee voltage value Vmin of each circuit inside the apparatus, at step 2a. If the battery output voltage Vout is lower than a minimum operation guarantee voltage value Vmin, the operation shifts to step 2i at which an alarm indicating that the battery is almost exhausted is generated. After that, supply of the operation voltage Vcc for each circuit inside the apparatus is interrupted at step 2j.

If the battery output voltage Vout is higher than a minimum operation guarantee voltage value Vmin, the operation shifts to step 2b at which the operation state of the apparatus is discriminated. That is, the operation state discrimination function 20a discriminates whether the current operation state of the apparatus is a specific operation state in which the current consumption is equal to or higher than a predetermined value, such as the output of ringing tone operation of the vibrator or turning on the backlight of the LCD 22, or a general operation state in which the current consumption is smaller than a predetermined value, such as a standby state, a communication state or the like.

If the operation state of the apparatus is the general operation state as a result of the discrimination, the remaining capacity display information is generated on the basis of the current battery output voltage Vout at step 2c, and the information is supplied to the LCD 22 and displayed thereon. Passage of a certain time is monitored at step 2e. After a certain time has passed, the operation returns to step 2a to input new battery output voltage Vout from the A/D converter 25, and the above control is repeated. The certain time is set to be a sampling cycle of the battery output voltage Vout.

It is assumed that the operation state of the apparatus is a specific operation state in which the ringing tone is generated or the vibrator is operated in accordance wit the incoming call. In this case, the control circuit 20 shifts to step 2f and discriminates whether or not the battery output voltage Vout of this time is higher than the preset discrimination value Vp. If the battery output voltage Vout is higher than the discrimination value Vp, the remaining capacity display information is generated on the basis of the battery output voltage value Vout obtained in the standby state immediately before the apparatus becomes in the above certain operation state and the information is displayed on the LCD 22.

Figure 3:
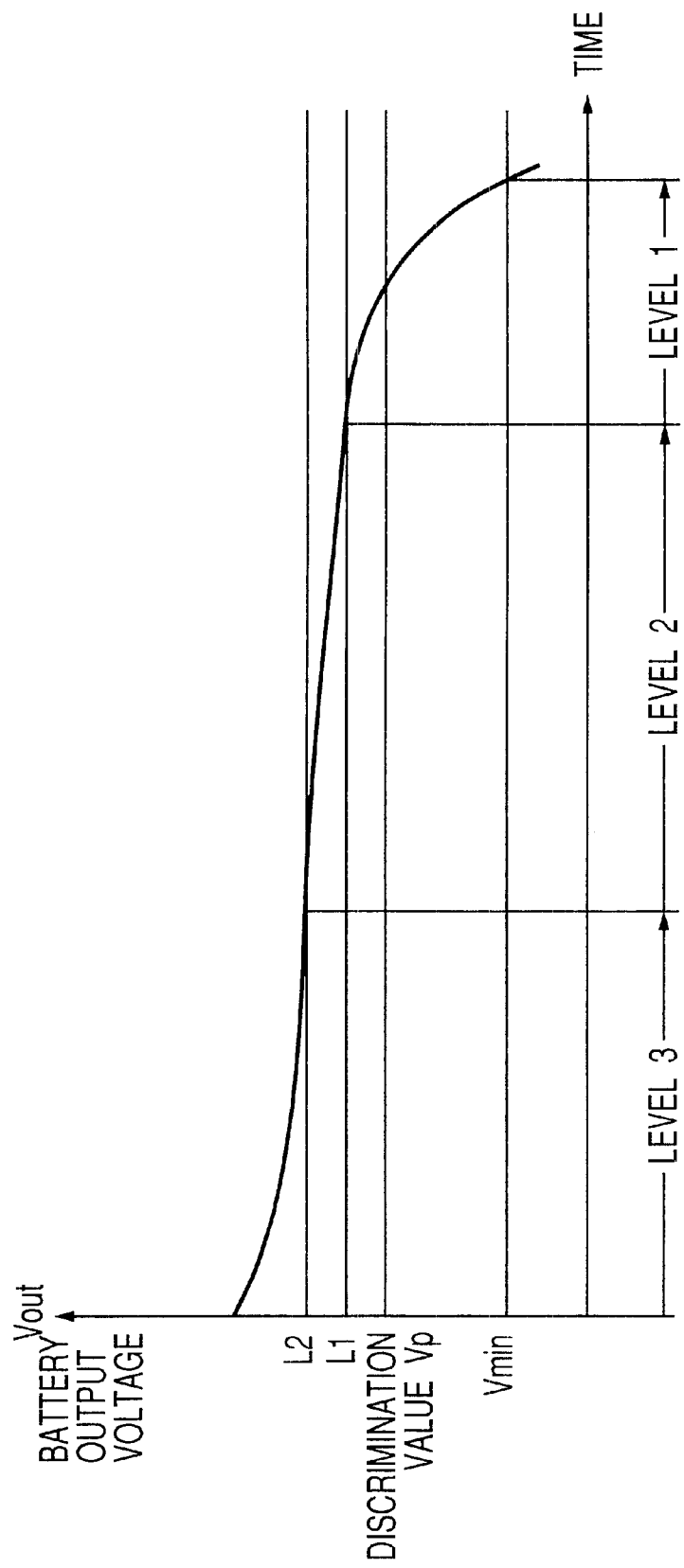
FIG. 3 is a graph showing an example of the discharging characteristics of the battery and the display of the battery remaining capacity.

For example, the battery 23 has the discharging characteristics as shown in FIG. 3 now. The remaining capacity of the battery is indicated by "LEVEL 3" when the battery output voltage Vout is higher than threshold value L2, "LEVEL 2" when the battery output voltage Vout is lower than threshold value L2 and higher than threshold value L1, and "LEVEL 1" when the battery output voltage Vout is lower than threshold value L1.

It is assumed that with these characteristics, for example, an incoming call occurs in a state in which the remaining capacity of the battery is at "LEVEL 3" and that in accordance with the incoming call the ringing tone is generated or the vibrator is operated. In this case, the battery output voltage Vout is temporarily lowered, causing the voltage drop as shown in, for example, an enlarged view of FIG. 4, during the reception indicating operation. If the remaining capacity of the battery is indicated in this state by employing the battery output voltage Vout as it is, similarly to the conventional control method, the battery output voltage Vout becomes lower than the threshold value L2 in a section represented by E in FIG. 4, during the reception indicating operation. Therefore, "LEVEL 2" is displayed as the remaining capacity display information. That is, the remaining capacity of the battery is erroneously displayed by the influence of the temporary voltage drop of the battery output voltage value Vout.

On the other hand, in a case where the display of the battery is controlled by the control circuit 20 of this embodiment, the battery output voltage Vout is higher than the discrimination value Vp at this time. During the reception indicating operation, the remaining capacity display information is therefore generated on the basis of the battery output voltage Vout at the standby time immediately before the start of this period, and the information is displayed on the LCD 22. That is, "LEVEL 3" is displayed without receiving the influence of the temporary voltage drop of the battery output voltage Vout. For this reason, the user of the apparatus can always recognize the exact remaining capacity of the battery even during the reception indicating operation.

If the battery output voltage Vout is lower than the discrimination value Vp, the control circuit 20 shifts to step 2c, generates the remaining capacity display information on the basis of the battery output voltage Vout of this time, and supplies the information and allows the information to be displayed thereon.

Figure 5:
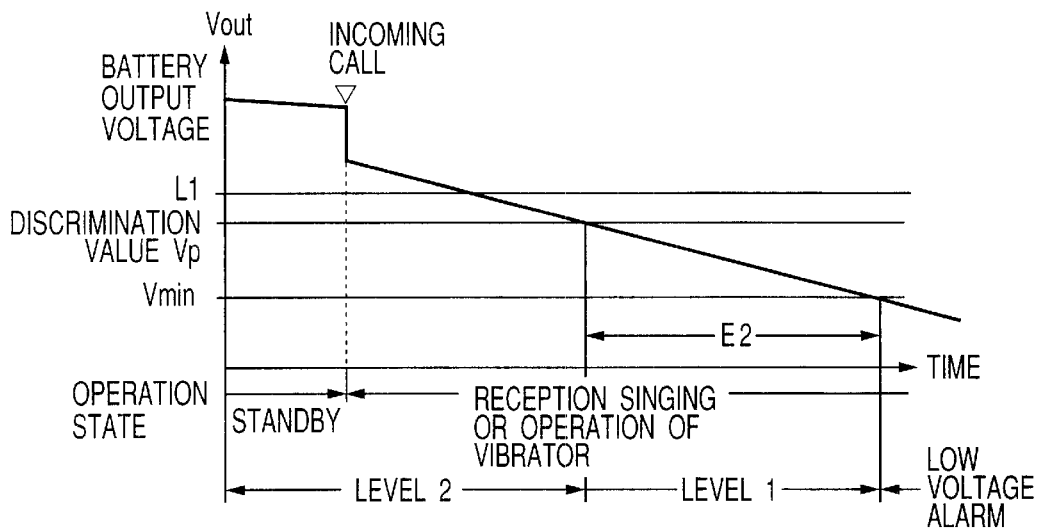
FIG. 5 is a graph explaining the battery display operation in a case where battery output voltage Vout is equal to or lower than discrimination value Vp.

It is assumed, for example, that the reception indicating operation is started while the battery output voltage Vout gets close to the threshold value L1 as shown in FIG. 5, and that the battery output voltage Vout becomes lower than the threshold value L1 and reaches the minimum operation guarantee voltage value Vmin during the reception indicating operation. In this case, the user cannot know anything about the remaining capacity of the battery according to the system of stopping the remaining capacity display during the reception indicating operation similarly to the prior art.

Figure 4:
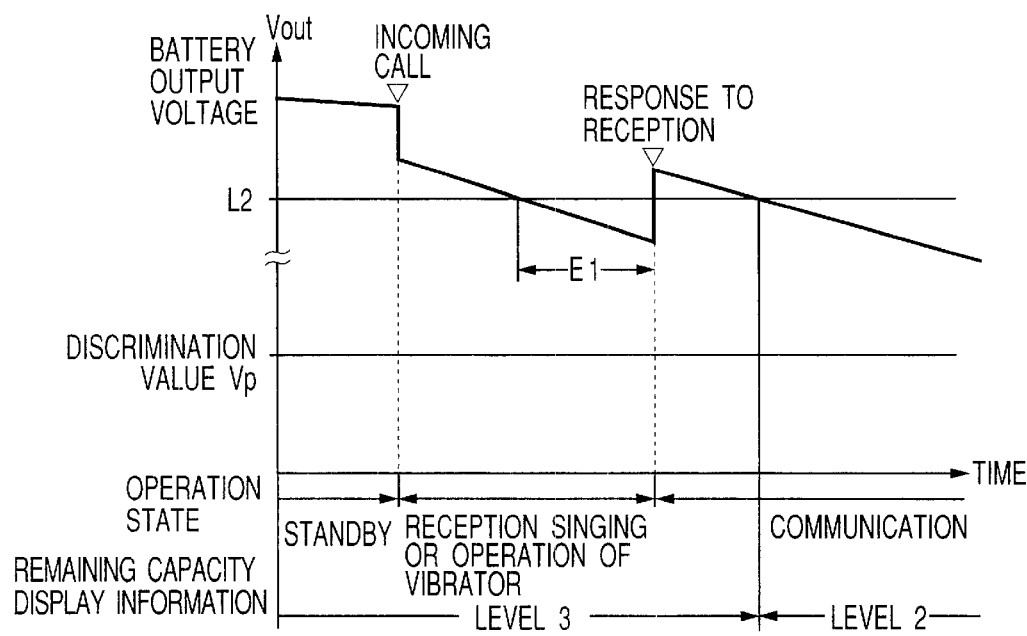
FIG. 4 is a graph explaining the battery display operation in a case where battery output voltage Vout is higher than discrimination value Vp.

However, if the display control is executed by the control circuit 20 of this embodiment, the remaining capacity display information generated on the basis of the battery output voltage Vout in a standby state immediately before the start of the reception indicating operation is displayed on the LCD 22, in the same manner as that shown in FIG. 4, in a section in which the battery output voltage Vout is higher than the discrimination value Vp. On the other hand, the remaining capacity display information is generated on the basis of the battery output voltage Vout of this time and displayed on the LCD 22 in a section in which the battery output voltage Vout is lower than the discrimination value Vp, i.e. in a section as represented by E2 of FIG. 5. That is, "LEVEL 2" is displayed in the section in which the battery output voltage Vout is higher than the discrimination value Vp while "LEVEL 1" is displayed in section E2 in which the battery output voltage Vout is lower than the discrimination value Vp.

For this reason, the user can confirm the remaining capacity of the battery even during the reception indicating operation. In addition, the remaining capacity of the battery obtained in the standby state immediately before the start of the remaining capacity display information is not displayed, but the remaining capacity of the battery corresponding to the battery output voltage Vout of this time is displayed in section E2 in which the battery output voltage Vout is lower than the discrimination value Vp and is almost exhausted. Therefore, the user can exactly recognize the small remaining capacity of the battery.

FIGS. 6A to 6C show examples of display results of the remaining capacity display information. FIG. 6A shows an example of "LEVEL 3", FIG. 6B shows an example of "LEVEL 2", and FIG. 6C shows an example of "LEVEL 1".

In addition, when the battery output voltage Vout has just become lower than the minimum operation guarantee voltage value Vmin, during the reception indicating operation, the low voltage alarm is generated at step 2i. After that, the supply of the power is interrupted at step 2j.

Thus, in this embodiment, the operation state of the apparatus is discriminated when the remaining capacity of the battery is displayed, and it is discriminated whether the battery output voltage Vout is higher or lower than discrimination value Vp when the apparatus is in the reception indicating operation. If the battery output voltage Vout is higher than discrimination value Vp, the remaining capacity of the battery corresponding to the battery output voltage Vout in the standby state immediately before the start of the reception indicating operation is displayed on the LCD 22. If the battery output voltage Vout is lower than discrimination value Vp, the remaining capacity of the battery corresponding to the battery output voltage Vout of this time is displayed as it is on the LCD 22.

Therefore, according to this embodiment, even when a specific operation of a large current consumption such as the reception indicating operation is being executed, if the battery output voltage Vout is higher than the discrimination value Vp, the remaining capacity of the battery in the standby state is displayed without receiving the influence of the temporary voltage drop of the battery output voltage Vout caused by the above specific operation. For this reason, inconvenience of erroneously displaying the remaining capacity of the battery smaller than the actual value can be prevented, and therefore the user can exactly recognize the remaining capacity of the battery.

If the battery output voltage Vout is lowered to the value near the minimum operation guarantee voltage value Vmin, the remaining capacity of the battery corresponding to the battery output voltage Vout detected in a specific operation state is displayed as it is. For this reason, even in a specific operation state, the user can confirm that the remaining capacity of the battery is being exhausted and can thereby properly judge whether or not he can continue the subsequent operations. In addition, the remaining capacity of the battery obtained in the standby state immediately before the start of the remaining capacity display information is not displayed, but the remaining capacity of the battery corresponding to the battery output voltage Vout of this time is displayed in the section where the battery output voltage Vout is lower than the discrimination value Vp and is almost exhausted. Therefore, the user can exactly recognize the small remaining capacity of the battery.

The present invention is not limited to the above-described embodiment. For example, in the above embodiment, the reception indicating operation has been explained as the specific operation state in which a large current is consumed. However, the present invention can also be applied even in a state of putting on a backlight for the LCD 22.

Further, a case where the remaining capacity of the battery is always displayed during the use of the apparatus has been explained in the above embodiment. However, the present invention can also be applied to a case of displaying the remaining capacity of the battery when the user operates displaying the remaining capacity of the battery.

Moreover, a case of displaying the remaining capacity of the battery at three stages from "LEVEL 3" to "LEVEL 1" has been explained in the above embodiment. However, the remaining capacity of the battery may be displayed at four or more stages. Otherwise, the remaining capacity of the battery may be displayed at no stage.

Moreover, a case of displaying the remaining capacity of the battery has been explained in the above embodiment. However, the consumption of the battery may be displayed. The consumption of the battery can be obtained on the basis of the output voltage Vout of the battery and the discharging characteristics of the battery, similarly to the remaining capacity of the battery.

Besides the remaining capacity of the battery and the consumption of the battery, other information concerning the capacity of the battery may be displayed. For example, a remaining time in which the apparatus can be operated with the remaining capacity of the battery may be obtained and displayed.

FIG. 7 is a flow chart showing the contents of the displaying process in this remaining time. When the control circuit 20 has ended the discrimination at step 2b or 2f shown in FIG. 2, the control circuit 20 calculates a presumed value of the remaining time to use the apparatus on the basis of the output voltage Vout of the battery, and preliminarily stored discharging characteristics of the battery and average power consumption value of the apparatus, at step 7a. The presumed value of the remaining time is displayed on the LCD 22 at step 7b. As for an example of display, the value of the remaining time may be displayed as a number or may be converted into a position of a hand of a clock.

In addition, if the apparatus, such as a digital camera or the like, repeats a determined short operation (for example, picking up still images), the remaining number of operations that can be executed with the remaining capacity of the battery may be obtained and displayed.

Moreover, the remaining capacity of the battery, the remaining time to use the apparatus, and the like are displayed on the LCD 22 in the above-described embodiments. For example, however, the speech systemization technique may be employed to generate a speech message indicating the remaining capacity of the battery, the remaining time to use the apparatus, and the like and output the speech message from the loud-speaker 11 or a sounder for outputting the ringing.

Moreover, a case of providing the battery indicating circuit in the cellular communication terminal apparatus has been explained in the above-described embodiments. However, the battery indicating circuit cannot be applied only to the cellular communication terminal apparatus, but to portable personal computers, portable radio sets, portable CD or MD players, video cameras and other battery-operated electronic devices.

The steps and contents of the battery indication control, indicating manner, discrimination value Vp, kinds of the battery, structure of the electronic circuit and electronic device, and the like can be variously modified in a range which does not exceed the gist of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A battery capacity indication circuit for generating and indicating information about a capacity of a battery supplying power to an electronic circuit, comprising:

means for detecting and keeping an output value of the battery in a state where the electronic circuit is operated by power supplied from the battery;

means for discriminating whether said electronic circuit is in a first operation state of consuming power smaller than a predetermined value or a second operation state of consuming power greater than the predetermined value in a state where the electronic circuit is operated by power supplied from the battery;

means for comparing the output value of the battery detected in said second operation state with a predetermined threshold value if it is discriminated that said electronic circuit is in the second operation state; and means for generating and indicating information about the capacity of said battery on the basis of the output value of said battery detected and kept in said first operation state before said electronic circuit becomes in said second operation state, if it is determined that the output value of said battery is equal to or greater than the threshold value.

2. A battery capacity indication circuit according to claim 1, wherein said indication means further comprises a function of generating and indicating information about the capacity of said battery on the basis of a current output value thereof, when it is discriminated as a result of the comparison executed by said comparison means that the output value of said battery is smaller than the threshold value.

3. A battery capacity indication circuit according to claim 1, wherein said indication means generates and indicates information about a remaining capacity of said battery on the basis of the output value thereof detected by said detection means.

4. A battery capacity indication circuit according to claim 1, wherein said indication means generates and indicates information about power consumption of said battery on the basis of the output value thereof detected by said detection means.

5. A battery capacity indication circuit according to claim 1, wherein said indication means obtains a remaining time to operate said electronic circuit on the basis of a current remaining capacity of said battery, on the basis of the output value of said battery detected by said detection means, discharging characteristics of said battery and an average value of the power consumption of said electronic circuit, and indicates information representing the remaining time.

6. A battery capacity indication circuit according to claim 1, wherein said indication means obtains a remaining number of times at which said electronic circuit repeats a determined operation, from a remaining capacity of said battery, on the basis of a current remaining capacity of said battery, on the basis of the output value of said battery detected by said detection means, discharging characteristics of said battery and an average value of the power consumption of said electronic circuit, and indicates information representing the remaining number of times.

7. A battery capacity indication circuit according to claim 1, wherein said discrimination means discriminates whether said electronic device is in a standby state or other operation state.

8. A battery-operated electronic device having a battery as a power supply, for supplying an output of said battery to an electronic circuit and selectively executing a plurality of kinds of determined operations, said electronic device comprising:

means for detecting and keeping an output value of said battery in a state where the electronic circuit is operated by power supplied from the battery, means for discriminating whether said electronic circuit is in a first operation state of consuming power smaller than a predetermined value or a second operation state of consuming power greater than the predetermined value in a state where the electronic circuit is operated by power supplied from the battery;

means for comparing the output value of the battery in said second operation state with a predetermined threshold value if it is discriminated that said electronic circuit is in the second operation state, and means for generating and indicating information about the capacity of said battery on the basis of the output value of said battery detected and kept in said first operation state before said electronic circuit becomes in said second operation state, if it is determined that the output value of said battery is equal to or greater than the threshold value.

9. A battery-operated electronic device according to claim 8, wherein said indication means further comprises a function of generating and indicating information about the capacity of said battery on the basis of a current output value thereof, when it is discriminated as a result of the comparison executed by said comparison means that the output value of said battery is smaller than the threshold value.

10. A battery-operated electronic device according to claim 8, wherein said indication means generates and indicates information about a remaining capacity of said battery on the basis of the output value thereof detected by said detection means.

11. A battery-operated electronic device according to claim 8, wherein said indication means generates and indicates information about power consumption of said battery on the basis of the output value thereof detected by said detection means.

12. A battery-operated electronic device according to claim 8, wherein said indication means obtains a remaining time to operate said electronic circuit on the basis of a current remaining capacity of said battery, on the basis of the output value of said battery detected by said detection means, discharging characteristics of said battery and an average value of the power consumption of said electronic circuit, and indicates information representing the remaining time.

13. A battery-operated electronic device according to claim 8, wherein said indication means obtains a remaining number of times at which said electronic circuit repeats a determined operation, from a remaining capacity of said battery, on the basis of a current remaining capacity of said battery, on the basis of the output value of said battery detected by said detection means, discharging characteristics of said battery and an average value of the power consumption of said electronic circuit, and indicates information representing the remaining number of times.

14. A battery-operated electronic device according to claim 8, wherein said discrimination means discriminates whether said electronic device is in a standby state or other operation state.

15. A cellular communication terminal apparatus having a battery as a power supply, for supplying an output of said battery to an electronic circuit and selectively executing a plurality of kinds of operations about cellular communication, said terminal apparatus comprising means for detecting and keeping an output value of said battery in a state where the electronic circuit is operated by power supplied from the battery, means for discriminating whether said electronic circuit is in a first operation state of consuming power smaller than a predetermined value or a second operation state at consummg power greater than the predetermined value in a state where the electronic circuit is operated by power supplied from the battery;

means for comparing the output value of the battery detected in said second operation state with a predetermined threshold value if it is discriminated that said electronic circuit is in the second operation state; and means for generating and indicating information about the capacity of said battery on the basis of the output value of said battery detected and kept in said first operation state before said electronic circuit becomes in said second operation state, if it is determined that the output value of said battery is equal to or greater than the threshold value.

16. A cellular communication terminal apparatus according to claim 15, wherein said indication means further comprises a function of generating and indicating information about the capacity of said battery on the basis of a current output value thereof, when it is discriminated as a result of the comparison executed by said comparison means that the output value of said battery is smaller than the threshold value.

17. A cellular communication terminal apparatus according to claim 15, wherein said indication means generates and indicates information about a remaining capacity of said battery on the basis of the output value thereof detected by said detection means.

18. A cellular communication terminal apparatus according to claim 15, wherein said indication means generates and indicates information about power consumption of said battery on the basis of the output value thereof detected by said detection means.

19. A cellular communication terminal apparatus according to claim 15, wherein said indication means obtains a remaining time to operate said electronic circuit on the basis of a current remaining capacity of said battery, on the basis of the output value of said battery detected by said detection means, discharging characteristics of said battery and an average value of the power consumption of said electronic circuit, and indicates information representing the remaining time.

20. A cellular communication terminal apparatus according to claim 15, wherein said indication means obtains a remaining number of times at which said electronic circuit repeats a determined operation, from a remaining capacity of said battery, on the basis of a current remaining capacity of said battery, on the basis of the output value of said battery detected by said detection means, discharging characteristics of said battery and an average value of the power consumption of said electronic circuit, and indicates information representing the remaining number of times.

21. A cellular communication terminal apparatus according to claim 15, wherein said discrimination means discriminates whether said electronic device is in a standby state or other operation state.

22. A cellular communication terminal apparatus according to claim 15, wherein said discrimination means discriminates whether said electronic device is in the standby state, a communication state or an operation state of executing at least one of generation of ringing, generation of vibration and putting on a display light.

23. A battery indication method of generating and indicating information about a capacity of a battery supplying power to an electronic circuit, said method comprising:

a detection step of detecting and keeping an output value of said battery in a state where the electronic circuit is operated by power supplied from the battery;

a discrimination step of discriminating whether said electronic circuit is in a first operation state of consuming power smaller than a predetermined value or a second operation state of consuming power greater than the predetermined, value in a state where the electronic circuit is operated by power supplied from the battery;

a comparison step of comparing the output value of the battery detected in said second operation state with a predetermined threshold value if it is discriminated that said electronic circuit is in the second operation state; and an indication step of generating and indicating information about the capacity of said battery on the basis of the output value of said battery detected and kept in said first operation state before said electronic circuit becomes in said second operation state, if it is determined that the output value of said battery is equal to or greater than the threshold value.

24. A battery indication method according to claim 23, further comprising a second indication step of generating and indicating information about the capacity of said battery on the basis of a current output value thereof, when it is discriminated as a result of the comparison executed at said comparison step that the output value of said battery is smaller than the threshold value.

25. A battery capacity indication circuit for indicating information about a remaining battery capacity, the battery supplying power to an electronic circuit, said circuit comprising:

means for detecting and keeping an output value of said battery in a state where the electronic circuit is operated by power supplied from the battery;

means for discriminating whether or not said electronic circuit is in a predetermined operation state in a state where the electronic circuit is operated by power supplied from the battery;

means for comparing the output value of the battery detected in said predetermined operation state with a predetermined threshold value if it is determined that said electronic circuit is in the predetermined operation state; and means for generating and indicating information about the remaining capacity of said battery on the basis of the output value which is detected and kept before said electronic circuit becomes in said predetermined operation state, if it is determined that the output value of said battery is equal to or greater than the threshold value.

* * * * *